US006994775B2

(12) United States Patent
Holesinger et al.

(10) Patent No.: US 6,994,775 B2

(45) Date of Patent: Feb. 7, 2006

(54) MULTILAYER COMPOSITES AND MANUFACTURE OF SAME

(75) Inventors: Terry G. Holesinger, Los Alamos, NM (US); Quanxi Jia, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 10/209,391

(22) Filed: Jul. 31, 2002

(65) Prior Publication Data

US 2004/0110042 A1 Jun. 10, 2004

(51) Int. Cl.
*C23C 14/34* (2006.01)

(52) U.S. Cl. ........................... 204/192.11; 204/192.24; 204/298.12; 204/298.13; 505/816

(58) Field of Classification Search ........... 204/192.11, 204/192.12, 192.24, 298.12, 298.13; 505/816; 427/372.2

See application file for complete search history.

(56) References Cited

U.S. PATENT DOCUMENTS

| | | | | | |
|---|---|---|---|---|---|
| 3,985,635 | A | * | 10/1976 | Adam et al. | 204/298.11 |
| 4,866,032 | A | * | 9/1989 | Fujimori et al. | 505/476 |
| 4,915,810 | A | * | 4/1990 | Kestigian et al. | 204/298.04 |
| 5,308,461 | A | * | 5/1994 | Ahonen | 204/192.11 |

* cited by examiner

*Primary Examiner*—Steven Versteeg
(74) *Attorney, Agent, or Firm*—Bruce H. Cottrell

(57) ABSTRACT

The present invention is directed towards a process of depositing multilayer thin films, disk-shaped targets for deposition of multilayer thin films by a pulsed laser or pulsed electron beam deposition process, where the disk-shaped targets include at least two segments with differing compositions, and a multilayer thin film structure having alternating layers of a first composition and a second composition, a pair of the alternating layers defining a bi-layer wherein the thin film structure includes at least 20 bi-layers per micron of thin film such that an individual bi-layer has a thickness of less than about 100 nanometers.

30 Claims, 2 Drawing Sheets

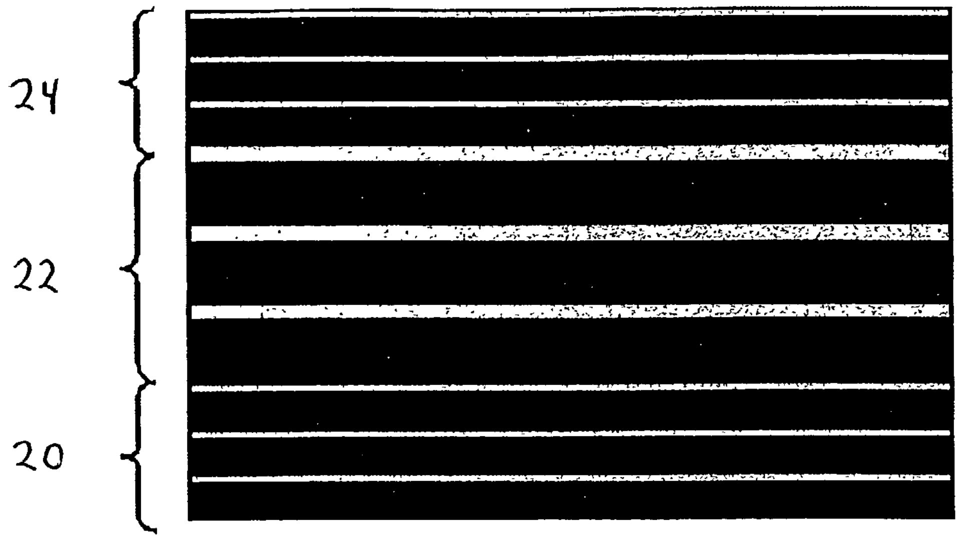
Fig. 2 Illustration of the change in periodicity of a film structure when deposition parameters are changed during a run with a sectored target.
Fig. 3
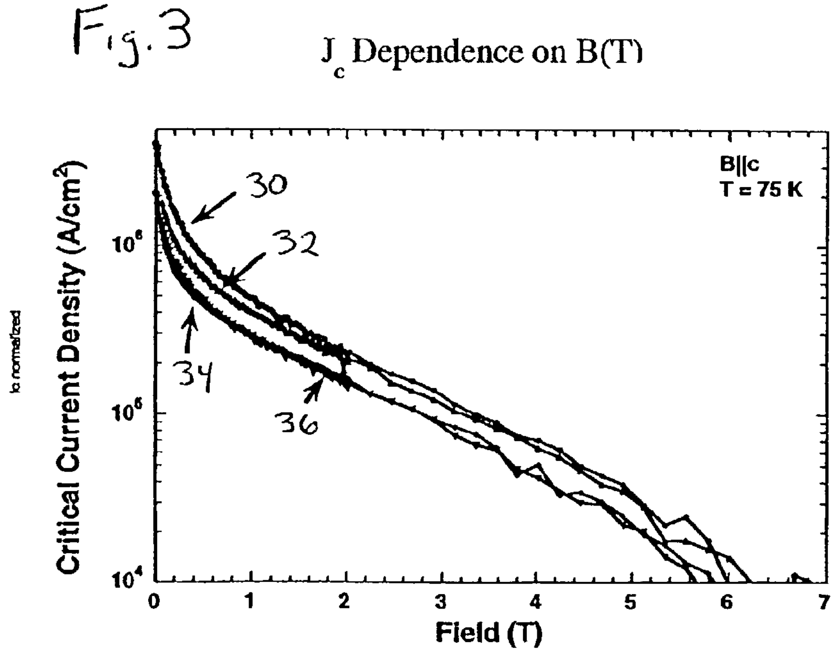
Field dependent measurements of the superconducting properties of various films.

MULTILAYER COMPOSITES AND MANUFACTURE OF SAME

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to a process and targets for the controlled deposition of multilayer films, e.g., multilayer high temperature superconducting (HTS) films, films having functionally graded compositions, e.g., HTS films having functionally graded compositions, and films doped with minor amounts of a second material, e.g., HTS films doped with minor amounts of a second material.

BACKGROUND OF THE INVENTION

One conventional process for the deposition of superconducting thick films, such as YBCO, and other industrial films such as semi-conductor films, ferroelectric films, insulating or optical coating films, and the like, is pulsed laser deposition (PLD). In such a process, a target, typically a disk-like shaped target, of the material or materials to be deposited is contacted with a laser beam of the desired energy and frequency. Commonly, such a disk-like target is rotated during the process to avoid contacting only a single spot of the target. In some PLD processes, a laser beam is simply rastered across sections of a target so that it is the laser beam that is moved rather than the target.

Since initial development, coated conductor research on HTS superconductors has focused on fabricating increasing lengths of the material, while increasing the overall critical current carrying capacity. Different research groups have developed several techniques of fabricating coated conductors. Regardless of which techniques are used for the coated conductors, the goal of obtaining highly textured superconducting thick films, such as $YBa_2Cu_3O_{7-x}$ (YBCO), with high supercurrent carrying capability on metal substrates remains. The use of thick superconducting films for coated conductors appears logical because both the total critical current and the engineering critical current density (defined as the ratio of total critical current and the cross-sectional area of the tape) are directly correlated with the thickness of the superconducting films.

Multilayer HTS films have recently been shown to yield high current superconducting composites because high quality, thick HTS coatings can be grown with multilayers.

U.S. Pat. Nos. 5,356,522 and 5,580,667 by Lai et al. describe the use of sectored targets in the preparation of thin film magnetic disks. Their sectored targets are designed for deposition via sputtering as the target moves consecutively linearly through successive regions of the sputtering system. They do not describe sectored disks, do not describe rotation of sectored targets during deposition, and do not describe deposition of high temperature superconducting materials.

SUMMARY OF THE INVENTION

In accordance with the purposes of the present invention, as embodied and broadly described herein, the present invention provides a process of depositing multilayer thin films by rotating a single target having at least two segments with differing compositions under a processing beam to generate processed material from the single target for deposition of the processed material upon a substrate, the processing beam contacting the segments with differing compositions in a controlled defined manner, and contacting the processed material from the single target with the substrate under conditions sufficient to deposit the processed material upon the substrate, where processed material from the segments with differing compositions is deposited in a predetermined defined manner as a multilayer thin film. The segment compositions can be single component or multicomponent materials.

In another embodiment, the present invention provides a process of depositing multilayer thin films by contacting a single target having at least two segments with differing compositions under a processing beam in a controlled defined manner thereby generating processed material from the single target for deposition of the processed material upon a substrate, and contacting the processed material from the single target with the substrate under conditions sufficient to deposit the processed material upon the substrate, where processed material from the segments with differing compositions is deposited in a predetermined defined manner as a multilayer thin film. The segment compositions can be single component or multicomponent materials.

Further, the present invention provides a disk-shaped target for deposition of multilayer thin films by a pulsed laser or pulsed electron beam deposition process, such a disk-shaped target including at least two segments with differing compositions. The segments can be single component or multicomponent materials.

Further, the present invention provides a multilayer thin film structure having alternating layers of a first composition and a second composition, a pair of the alternating layers defining a bi-layer wherein the thin film structure includes at least 20 bi-layers per micron of thin film such that an individual bi-layer has a thickness of less than about 50 nanometers. In another embodiment, the alternating layers can include more than two compositionally different layers such that a tri-layer, quad-layer or the like is defined and the thin film structure can include a large multiple of such tri-layers, quad-layers or the like per micron of thin film.

BRIEF DESCRIPTION OF THE FIGURES

FIG. 2 shows a film structure obtainable with a sectored target when deposition parameters are varied during deposition in accordance with the present invention.

FIG. 3 shows a plot of field dependent measurements of superconducting properties of various multilayer films produced in accordance with the present invention.

DETAILED DESCRIPTION

Figure 1:
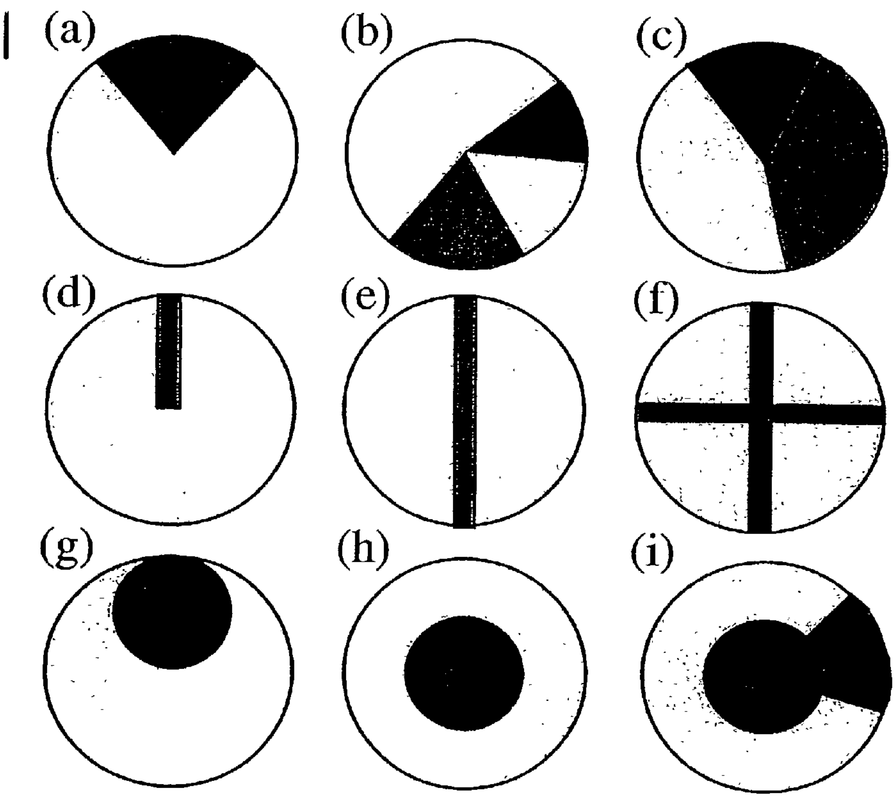
FIGS. 1(*a*)–(*i*) show exemplary configurations for targets in accordance with the present invention.

The present invention is concerned with targets and a process for the preparation of multilayer films, e.g., high temperature superconducting (HTS) films, films having functionally graded compositions, e.g., HTS films having functionally graded compositions, and films doped with minor amounts of a second material, e.g., HTS films doped with minor amounts of a second material. The applications of the present invention are widespread. Not only is it very applicable to the superconductor industry, but also of interest to other film-related industries for films such as semiconductors, ferroelectrics, magnetic coatings, magnetoresistance materials, thermoelectrics, insulators, optical coatings and the like. Multilayer structures with repeating layers have been previously described for magnetic films of, e.g., Pt/Co, PdCo and the like and for such films using intermediate insulating layers of $SiO_2$ and the like, for giant magnetoresistance structures of, e.g., alternating ferromagnetic and non-magnetic layers, for thermoelectric materials such as trilayer structures of repeating layers of PbTe, PbSeTe and Te and the like, and semiconductor structures of, e.g., repeating trilayers of InAs, GaSb and AlSb and the like. Each such previous structure may be prepared using the process and sectored target of the present invention by properly designing the target and process.

The present invention allows the growth of high-density multilayer structures sometimes referred to as superlattice-like structures. The term "superlattice structure" refers to a composite structure made of alternating ultrathin layers of different component materials. A superlattice structure typically has an energy band structure which is different than, but related to, the energy band structures of its component materials. The selection of the component materials of a superlattice structure, and the addition of relative amounts of those component materials, will primarily determine the resulting properties of a superlattice structure as well as whether, and by how much, those properties will differ from those of the individual component materials a superlattice structure.

The process of the present invention can allow preparation of multilayer composites with a wide range of thicknesses with from a single unit (of alternating layers of the different deposited materials, e.g., a bi-layer of a first composition and a second composition) up to many units with total combined thicknesses greater than, e.g., one micron.

The targets and process of the present invention allow the use of only a single pulsed laser deposition (PLD) target in the preparation of multilayer films, e.g., multilayer HTS films. A target is formed prior to use to contain one or more additional sectors, regions, or other shapes that have a different composition of material relative to the primary matrix of the target as shown in FIGS. 1(*a*)–(*i*). Due to the simplistic design and easy use in existing PLD systems, the present invention offers significant advantages in terms of composition and structural control that are not readily accessible by other processes.

The HTS composites are, in the broadest sense, composed of a substrate, possibly one or more buffer layers, and an HTS film, which is the functional object of the composite. The substrates can be single crystal substrates such as strontium titanate (STO) or yttria-stabilized zirconia (YSZ), textured polycrystalline substrates such as roll-textured nickel (RABiTS), or non-textured polycrystalline substrates that have a textured template film deposited on the surface such as an ion-beam-assist deposited YSZ or MgO film on a nickel alloy, e.g., a nickel-chromium alloy. Often, but not always, buffer layers are employed to facilitate the deposition of a final HTS layer. Examples of buffer materials can include cerium oxide, strontium titanate, strontium ruthenate, yttrium oxide, and lanthanum manganate ($LaMnO_3$). The final layer can be a film or composite film that contains a desired HTS material such as YBCO (Y-123).

The substrates can be other materials for other applications such as semiconductors, ferroelectrics, magnetic coatings, magnetoresistance materials, thermoelectrics, insulators, optical coatings and the like. For example, for ferroelectrics, suitable substrates can include silicon, platinum-coated silicon and other conductive material-coated silicon. For semiconductors, suitable substrates can include stainless steel, molybdenum and silicon. For magnetic coatings, suitable substrates can include silicon. For magnetoresistance materials, suitable substrates can include nonmagnetic materials such as glass, silicon, aluminum oxide ($Al_2O_3$), titanium carbide (TiC), silicon carbide (SiC), a sintered product of aluminum oxide and TiO, or ferrite. For thermoelectrics, suitable substrates can include highly insulating silicon or silicon on an insulator (SOI).

The factors of pulsed laser deposition (PLD) that are important in the practice of the present invention to form desired structures include the target rotation speed, pulse rate, pulse energy, and distance from the target center to the point on the target where the laser beam is incident. Variations in these parameters in conjunction with specially designed targets can affect the periodicity and compositional makeup of the resulting film. These variations can be made between runs or changed during film deposition in either a stepwise or continuous manner.

Similarly, the factors of pulsed electron beam deposition (PEBD) that are important in the practice of the present invention to form desired structures include the target rotation speed, pulse rate, pulse energy, and distance from the target center to the point on the target where the electron beam is incident. Variations in these parameters in conjunction with specially designed targets can affect the periodicity and compositional makeup of the resulting film. These variations can be made between runs or changed during film deposition in either a stepwise or continuous manner.

The design of an individual target can allow an additional manner of film deposition control. Examples of these targets are shown in FIGS. 1(*a*)–(*i*). FIGS. 1(*a*)–(*c*) show pie-shaped sectors that comprise a designed portion of the target. The fraction each sector or sectors comprise of the target can be varied in a continuous manner depending upon the needs of the intended final product. The sectored target is useful in making multilayer films where periodicity is determined by the rotation speed of the target, pulse rate, and energy of the laser. Changes in periodicity within a given deposition can be obtained by varying in a stepwise or continuous manner the target rotation speed, laser pulse rate and laser energy. An example of the change in structure or periodicity is shown in FIG. 2. Functionally graded materials can be obtained by simply changing the rotation rate of the target in a continuous manner during a specific deposition run. Initial rotation rate settings can produce the periodicity in multilayers shown at 20 in FIG. 2. Simply by slowing the rotation rate, the periodicity in multilayers can be thicker as shown at 22. Changing back to the original rate settings can again produce the periodicity in multilayers shown at 24 the same as the original periodicity shown at 20. By varying the laser rate and/or the target rotation, the resultant multilayer thin film can have a continuously varying periodicity. Such a periodicity could gradually go from thinner layers to thicker layers, from thicker layers to thinner layers, or many other possible configurations.

Other target designs are shown in FIGS. 1(*d*)–(*i*) and can be used to make periodic structures of perform controlled deposition of second phase particles within a film, e.g., an HTS film. Since the one or more modified sectors of the target are not pie shaped in these designs, the distance from the center of the target where the laser is incident now becomes an additional parameter that can be changed in a continuous manner to affect the composition and structure of the resulting film, e.g., a HTS film.

Structures such as shown in FIGS. 1(*h*) and (*i*) would allow an operator to switch between materials in a given run without having to switch targets. For example, the target shown in FIG. 1(*h*) could be comprised of a buffer layer material for the inner circle surrounded by an HTS material. The same could be said of FIG. 1(*i*) except that now a multilayer structure could be formed in either the buffer layer or the HTS film. The examples discussed here demonstrate the wide range of possibilities available using a sectored target.

The differing segment compositions for superconducting applications can employ various combinations of rare-earth-barium-copper oxides (RE-BCO) for the different layers of a resultant multilayer superconductive structure. The rare earth metals can generally be any suitable rare earth metal from the periodic table, but are preferably chosen from among yttrium, neodymium, samarium, europium, gadolinium, erbium, dysprosium and ytterbium. In a multilayer example, combinations for a first and third layers (with an interlayer of insulating, conducting or superconducting material) may include, for example, both layers of one mixed rare earth oxide combination, or one mixed rare earth oxide combination in the first layer and a different mixed rare earth oxide combination in the third layer. For multilayer composites with more than three layers, the possible mixture combinations would multiply but can readily be worked out by one skilled in the art. Yttrium is a preferred rare earth to include in forming the mixed rare earth oxide combinations.

In other applications such as semiconductors, ferroelectrics, magnetic coatings, ferromagnetic or magnetoresistance materials, thermoelectrics, insulators and the like, the differing materials for the segmented compositions are selected for the particular application. For example, for ferroelectrics, suitable segmented compositions can be of, e.g., strontium titanate, barium titanate, lead zirconium titanate (PZT) and barium titanate. For semiconductors, suitable segmented compositions can be of, e.g., gallium arsenide (GaAs), indium arsenide (InAs), gallium antimonide (GaSb), indium phosphide (InP), lead telluride (PbTe), gallium nitride (GaN), gallium phosphide (GaP), aluminum antimonide (AlSb) and the like. For magnetic coatings, suitable segmented compositions can be of platinum and cobalt, palladium and cobalt, terbium and iron and the like. For magnetoresistance materials, suitable segmented compositions can be of lanthanum strontium manganate ($La_{0.7}Sr_{0.3}MnO_3$), neodymium strontium manganate ($Nd_{0.7}Sr_{0.3}MnO_3$), lanthanum calcium manganate ($La_{0.7}Ca_{0.3}MnO_3$), lanthanum manganate ($LaMnO_3$), and the like. For thermoelectrics, suitable segmented compositions can be, e.g., of lead-telluride (PbTe), lead-selenide-telluride (PbSeTe) and tellurium (Te).

The targets used in the examples were manufactured by traditional bulk sintering techniques. In one embodiment, bulk superconducting powders were manufactured separately by mechanical milling in isopropanol, drying, and then calcinating at 900° C. for 25 hours.

Targets were formed by forming a pie-shaped piece of metal to fit inside a disk-shaped die (2-inch diameter of a circular shape). A first material powder was loaded into the pie-shaped piece of metal while a second material powder was loaded around the remainder of the die. The first material powder can comprise as little or as much of the overall target volume as desired. The metal form can then be removed and the target pressed at 15 kilograms per square inch (kpsi) for a few seconds. The resultant segmented target can then be removed from the die and sintered in an oven to fully form the individual superconducting materials (for the superconducting embodiment) and to bond the first and second materials into a solid target. The target was ramped at 4° C. per minute to 900° C. and held for 25 hours in an oxygen atmosphere. It was then ramped down to 400° C. and held for 25 hours, ramped back up to 925° C. and held for 25 hours, then ramped down to 400° C. and held for an additional 75 hours. After the latter step, the sample was allowed to furnace cool (i.e., cool down by simply turning off the furnace) to room temperature. Such heating stages are not necessary for every type material that can be used as a material of a segment composition.

A film was deposited upon a STO substrate using the above target. The film thickness was about 5000 Angstroms and the $T_c$ was 92 K. The measured $J_c$ of the film was $4\times10^6$ amperes per square centimeter (A/$cm^2$) at 75.5 K. The structure of the film consisted of a high-density arrangement of multilayers. The periodicity of the bi-layer structure was less than 20 nm. The number of individual layers, Y-123 and Eu-123, per micron exceeded 140. The field dependence of the superconducting properties of the film is shown at 30 in FIG. 3. The properties were found to be as good as some of the best single component YBCO films that have been made in the same laboratory and shown at 32, 34 and 36.

Other methods of making, e.g., the multilayer structures are to use individual targets that are then interchanged to make the different layers. However, this is somewhat labor intensive and not practical for making the ultrafine multilayers as described by the present invention. Another method of making multilayers is described in a prior LANL patent where a mixed rare-earth superconducting film is deposited and subsequently post-annealed to produce a layered structure due to solubility instability and film segregation into different phases and multiple layers. However, this approach is limited to certain materials that exhibit a thermodynamic instability and segregate into the two different phases with changes in annealing conditions. In contrast, the present invention is limited only to the extent that the materials put into the target do not significantly react with one another during the final sintering step during preparation of a robust target.

The present invention is seen as having applications in terms of adding a discrete second phase in the superconducting film. Having the second phase as a discrete section of a target results in the PLD system putting selected material at a regular interval onto the substrate that has the stoichiometry only of the second phase. Uniformly mixing this second phase into the target would not accomplish this result.

The process and targets of the present invention are also of interest to other film deposition techniques where a target is employed such as in sputtering. When sputtering, different materials typically have different sputtering rates. With a sectored target of the present invention, only one source or target would be needed which simplifies design and reduces costs for any deposition system. The sector or other shape within the target would be changed to account for different sputtering rates for different materials and to tailor the composition to the desired values. In this manner, only one sputtering target and gun would be needed.

The present invention is more particularly described in the following examples which are intended as illustrative only, since numerous modifications and variations will be apparent to those skilled in the art.

EXAMPLE 1

Bulk superconducting powders of $Y_{1.015}Ba_2Cu_3O_y$ (Y-123) and $Eu_{1.015}Ba_2Cu_3O_y$ (Eu-123) were manufactured separately by mechanical milling in isopropanol, drying, and then calcinating at 900° C. for 25 hours. A pie-shaped piece of metal was then formed to fit inside a 2-inch diameter die. The Eu-123 powder was loaded into the pie-shaped piece of metal while the Y-123 powder was loaded around the remainder of the 2-inch die. In this example, the Eu-123 powder comprised approximately ⅙ of the overall target volume. The metal was removed and the target pressed at 15,000 pounds per square inch (psi) for a few seconds. The target was removed from the die and then sintered in an oven to fully form the individual superconducting materials and to bond the materials into a solid target. The target was ramped at 4° C. per minute to 900° C. and held for 25 hours in an oxygen atmosphere. It was then ramped down to 400° C. and held for 25 hours, ramped back up to 925° C. and held for 25 hours, then ramped down to 400° C. and held for an additional 75 hours. After the latter step, the sample was allowed to furnace cool (i.e., cool down by simply turning off the furnace) to room temperature.

EXAMPLE 2

A film was deposited upon a STO substrate using the target from Example 1. The film thickness was about 5000 Angstroms and the $T_c$ was 92 K. The measured $J_c$ of the film was $4\times10^6$ amperes per square centimeter ($A/cm^2$). The structure of the film consisted of a high-density arrangement of multilayers. The periodicity of the bi-layer structure was less than 20 nm. The number of individual layers, Y-123 and Eu-123, per micron exceeded 140. The number of bi-layer pairs (70) translates into a periodicity of less than 20 nm for every pair of alternating layers. Hence, controlled ultra-fine microstructural features in an HTS composite structure can be obtained. The field dependence of the superconducting properties of the film is shown in FIG. 3. The properties were found to be as good as some of the best single component YBCO films that have been made in the same laboratory.

EXAMPLE 3

Powders of Y-123 and $Sm_{1.015}Ba_2Cu_3O_y$ (Sm-123) were used to make two targets in a similar manner to the Y/Eu target of Example 1. In the first of these targets, the Sm-123 powder comprised about ⅙ of the target with the balance made up of the Y-123 powder. In the second of these targets, the Y-123 powder comprised about ⅙ of the target with the balance made up of the Sm-123 powder. Films were made on IBAD-YSZ coated Hastelloy metal substrates. An intervening layer of $CeO_2$ was deposited prior to using the sectored target. In the case where the Sm-123 made up ⅙ of the target, a film with a $T_c$ of 92.4 K and an average $J_c$ value from microbridge measurements of $0.775\times10^6$ $A/cm^2$ was obtained. In the other film made where the Y-123 made up ⅙ of the target, a film with a $T_c$ of 92.4 K and an average $J_c$ value from microbridge measurements of $1.2\times10^6$ $A/cm^2$ was obtained.

EXAMPLE 4

A sectored target similar to that shown in FIG. 1(*d*) was also fabricated. In that instance, a $Gd_2BaCuO_y$ (Gd-211) powder was used to make a sector and Y-123 powder made up the remainder of the target. To fabricate this target, the Gd-211 powder was first put into a silver sheath and pressed in a rectangular die to fabricate a rectangular shaped sector for the target. This piece was then placed in the 2-inch die and the Y-123 powder was filled in around it. The target was then pressed together at 15 kspi and then sintered as before. A thin film was deposited upon a STO substrate using this target. The $T_c$ of the film was 90.8 K. The $J_c$ of the film was at least $1.6\times10^6$ $A/cm^2$ at liquid nitrogen temperatures. There was some problem in measuring the actual thickness of the film such that the $J_c$ value was considered a conservative estimate.

EXAMPLE 5

Bulk superconducting powders of $Dy_{1.015}Ba_2Cu_3O_y$ (Dy-123) and $Eu_{1\ 015}Ba_2Cu_3O_y$ (Eu-123) were manufactured separately by mechanical milling in isopropanol, drying, and then calcinating at 900° C. for 25 hours. A pie-shaped piece of metal was then formed to fit inside a 2-inch diameter die. The Eu-123 powder was loaded into the pie-shaped piece of metal while the Dy-123 powder was loaded around the remainder of the 2-inch die. In this example, the Eu-123 powder comprised approximately ⅓ of the overall target volume. The metal was removed and the target pressed at 15 kilograms per square inch (kpsi) for a few seconds. The target was removed from the die and then sintered in an oven to fully form the individual superconducting materials and to bond the materials into a solid target. The target was ramped at 4° C. per minute to 900° C. and held for 25 hours in an oxygen atmosphere. It was then ramped down to 400° C. and held for 25 hours, ramped back up to 925° C. and held for 25 hours, then ramped down to 400° C. and held for an additional 75 hours. After the latter step, the sample was allowed to furnace cool (i.e., cool down by simply turning off the furnace) to room temperature.

EXAMPLE 6

A film was deposited upon on an IBAD-YSZ coated Hastelloy metal substrate using the target from Example 5. The film thickness was about 5000 Angstroms and the $T_c$ was 92.9 K and a transition temperature width of 0.5 K.

Although the present invention has been described with reference to specific details, it is not intended that such details should be regarded as limitations upon the scope of the invention, except as and to the extent that they are included in the accompanying claims.

What is claimed is:

1. A process of depositing multilayer thin films comprising:

rotating a single target having at least two segments with differing compositions under a processing beam to generate processed material from said single target for deposition of said processed material upon a substrate, said processing beam contacting said at least two segments with differing compositions in a controlled defined manner; and, contacting said processed material from said single target with said substrate under conditions sufficient to deposit said processed material upon said substrate, where processed material from said at least two segments with differing compositions is deposited in a predetermined defined manner as a multilayer thin film.

2. The process of claim 1 wherein differing compositions are at least two different superconducting precursor compositions.

3. The process of claim 2 wherein said process further includes annealing said deposited processed materials at temperatures and for time sufficient to form a final superconducting article.

4. The process of claim 1 wherein said target is disk-shaped.

5. The process of claim 1 wherein said at least two different compositions are a first material of superconducting YBCO and a second material selected from the group consisting of SmBCO, EuBCO and GdBCO.

6. The process of claim 5 wherein said processing beam is a pulsed laser beam.

7. The process of claim 5 wherein said processing beam is a pulsed electron beam.

8. The process of claim 5 wherein said processing beam is a plasma.

9. The process of claim 1 wherein said differing compositions are at least two different compositions to produce a multilayer film structure selected from the group consisting of semiconductors, ferroelectrics, magnetic coatings, magnetoresistance materials and insulators.

10. The process of claim 1 wherein said single target includes three segments with differing compositions, said differing compositions are three different compositions to produce a multilayer film structure selected from the group consisting of semiconductors, ferroelectrics and thermoelectrics.

11. The process of claim 1 wherein said controlled defined manner is repetitive and said predetermined defined manner is repetitive.

12. The process of claim 1 wherein said multilayer thin film includes individual layers of at least two differing thicknesses.

13. The process of claim 1 wherein said multilayer thin film includes alternating layers defining a bi-layer and said bi-layers have a single repeating periodicity.

14. The process of claim 1 wherein said multilayer thin film includes alternating layers defining a bi-layer and said bi-layers have continuously varying periodicity.

15. The process of claim 1 wherein said multilayer thin film includes alternating layers defining a bi-layer and said bi-layers have at least two different periodicities.

16. The process of claim 15 wherein said at least two different periodicities are repeating.

17. The process of claim 1 wherein said multilayer thin film includes alternating layers of a first composition and a second composition, a pair of said alternating layers defining a bi-layer wherein said thin film includes at least 20 bi-layers per micron of thin film such that an individual bi-layer has a thickness of less than about 50 nanometers.

18. A process of depositing multilayer thin films comprising:

contacting a single target having at least two segments with differing compositions with a processing beam in a controlled defined manner thereby generating processed material from said single target for deposition of said processed material upon a substrate; and, contacting said processed material from said single target with said substrate under conditions sufficient to deposit said processed material upon said substrate, where processed material from said at least two segments with differing compositions is deposited in a predetermined defined manner as a multilayer thin film.

19. The process of claim 18 wherein said substrate is in a fixed position during deposition.

20. The process of claim 18 wherein said processing beam is a pulsed laser beam.

21. The process of claim 20 wherein said pulsed laser beam is moved relative to said target during said contacting in a controlled defined manner.

22. The process of claim 20 wherein said target is moved relative to said pulsed laser beam during said contacting in a controlled defined manner.

23. The process of claim 18 wherein said multilayer thin film includes alternating layers of a first composition and a second composition, a pair of said alternating layers defining a bi-layer wherein said thin film includes at least 20 bi-layers per micron of thin film such that an individual bi-layer has a thickness of less than about 50 nanometers.

24. A disk-shaped target for deposition of multilayer thin films by a pulsed deposition process, said disk-shaped target comprising at least two segments with differing compositions wherein at least one segment is a segment of a superconducting material.

25. The disk-shaped target of claim 24 wherein said target includes a first segment of YBCO and a second segment of a material selected from the group consisting of SmBCO, EuBCO and GdBCO.

26. The disk-shaped target of claim 24 wherein said target includes a first segment of YBCO and a second segment of SmBCO.

27. The disk-shaped target of claim 24 wherein said target includes a first segment of YBCO and a second segment of EuBCO.

28. The disk-shaped target of claim 24 wherein said target includes a first segment of YBCO and a second segment of GdBCO.

29. The disk-shaped target of claim 24 wherein said target includes a first segment of DyBCO and a second segment of EuBCO.

30. The disk-shaped target of claim 24 wherein said target includes a first segment of GdBCO and a second segment of EuBCO.

* * * * *